(12) United States Patent
Arakawa

(10) Patent No.: US 6,281,126 B1
(45) Date of Patent: *Aug. 28, 2001

(54) PROCESS FOR MANUFACTURING SEMICONDUCTOR DEVICE

(75) Inventor: Yoshikazu Arakawa, Tokyo (JP)

(73) Assignee: Oki Electronic Industry Co., Ltd., Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/174,656

(22) Filed: Oct. 19, 1998

(30) Foreign Application Priority Data

Mar. 16, 1998 (JP) .................................. 10-065901

(51) Int. Cl.$^7$ ...................................... H01L 21/44
(52) U.S. Cl. ............................... 438/682; 438/651
(58) Field of Search .................... 438/151, 627, 438/637, 638, 639, 640, 643, 682, 721, 755, 651, 581

(56) References Cited

U.S. PATENT DOCUMENTS 4,056,642 * 11/1977 Saxema et al. ..................... 427/84
5,814,537 * 9/1998 Maa et al. ........................... 438/151
5,827,778 * 10/1998 Yamada ............................... 438/637
5,841,195 * 11/1998 Lin et al. ............................. 257/774
5,998,847 * 12/1999 Assaderaghi et al. .............. 257/401

* cited by examiner

Primary Examiner—David Nelms
Assistant Examiner—David Nhu
(74) Attorney, Agent, or Firm—Venable; Norman N. Kunitz

(57) ABSTRACT

A gate oxide layer 11 and a poly-silicon layer 12 are formed on a silicon substrate 10. A tungsten silicide (WSi) layer that includes dopant is formed by a sputtering method or CVD as the metal silicide layer. This layer is designated a first wiring pattern layer 13. Subsequently, a gate G is formed by removing the surrounding portion of the gate oxide layer 11, the poly-silicon layer 12 and the first wiring pattern layer 13, and an insulator film 14 is formed by thermal oxidation. Then, a first insulator layer 15 is formed from BPSG, and a contact hole 16 is formed through the first insulator layer 15. After that, a second wiring pattern layer 17 is formed by CVD for covering the first insulator layer 15 as well as the contact hole 16, BPSG is deposited on the second wiring pattern layer 17, and becomes a second insulator layer 18 through thermal treatment. The concentration of the dopant in the first wiring pattern layer 13 equals or is larger than that in the second wiring pattern layer 17.

16 Claims, 4 Drawing Sheets

PROCESS FOR MANUFACTURING SEMICONDUCTOR DEVICE

BACKGROUND OF THE INVENTION

The present invention relates to a manufacturing process of a semiconductor device such as IC, a sputtering target for a metal silicide wiring pattern and a manufacturing process for the sputtering target.

FIG. 4 shows a conventional process for forming an FET gate on a silicon substrate and for contacting the gate with a wiring pattern on an upper layer via a contact hole. As shown in FIG. 4(a), 7 through 15 nm in thickness of a gate oxide layer 2 is formed on a surface of a silicon substrate 1 through the thermal oxidation process, and poly-silicon is deposited by CVD (chemical vapor deposition) and doped with phosphorus (P) or arsenic (As) in an ion implantation process in order to form a doped poly-silicon layer 3. Then, a metal silicide having a high melting point such as tungsten silicide (WSi) is formed on the poly-silicon layer in CVD or the sputtering method, thereby forming a first wiring pattern layer 4.

A gate G is, as shown in FIG. 4(b), formed on the stacked layers through the photo lithography process and an insulator film 5 is formed by thermal oxidation at 800 to 900° C.

Subsequently, as shown in FIG. 4(c), BPSG (borophosphosilicate glass) is deposited by CVD and a first insulator layer 6 is formed through the thermal oxidation. A contact hole 7 is opened through the first insulator layer 6 and the insulator film 5 on the gate. A poly-silicon film is formed by CVD, as shown in FIG. 4(c), and phosphorus (P) is diffused or arsenic (As) is doped by ion implantation into the poly-silicon film to form a second wiring pattern layer 8. Then, an electrode pattern is formed on the second wiring pattern layer 8 in a photo lithography process. Finally, as shown in FIG. 4(e), a BPSG layer is formed by CVD and the formed layer is thermally treated to form a second insulator layer 9.

In the conventional wiring process, however, since the thermal treatment for forming the second insulator layer 9 causes diffusion of the dopant such as phosphorus (P) or arsenic (As) into the first wiring pattern layer 4 from the second wiring pattern layer 8, it increases the contact resistance between the first and second wiring pattern layers 4, 8, and the predetermined transistor properties cannot be achieved due to failing of the ohmic contact.

Further, when the first wiring pattern layer 4 is formed in the sputtering method, abnormal discharge occurs due to charge-up of silicon included in the sputtering target. Thus the silicon is scattered on the wafer as particles, and they may cause an unnecessary short-circuit. The sputtering target for forming the first wiring pattern layer 4 is a mixture of tungsten (W) and silicon (Si) whose molar ratio W:Si is 1:2.6 to 1:2.8. The molar ratio of tungsten silicide (WSi$_2$) as a pure compound is 1:2. The sputtering target is produced by mixing tungsten silicide with silicon particles and by baking the mixture under high-pressure. Since the mixed silicon particles has exceedingly low conduction, it causing charge-up in a well-used DC magnetron sputtering method.

SUMMARY OF THE INVENTION

The present invention has been accomplished in view of the above problems, and it is a first object of the invention to provide a process for manufacturing a semiconductor device that can prevent the increment of the contact resistance due to diffusion of dopant from the second wiring pattern layer to the first wiring pattern layer (a metal silicide layer) during a thermal treatment of an insulator layer.

Furthermore, a second object of the present invention is to provide a sputtering target that can prevent particles due to charge-up and a manufacturing method thereof.

According to a first aspect, there is provided a process for manufacturing a semiconductor device comprising: a first wiring pattern forming step in which a first wiring pattern layer is formed from metal silicide including dopant; an insulator layer forming step in which an insulator layer is formed to cover the first wiring pattern layer; a contact hole forming step in which a contact hole is formed through the insulator layer; a second wiring pattern forming step in which a second wiring pattern including dopant is formed for covering the insulator layer as well as the contact hole; and wherein the concentration of the dopant in the first wiring pattern layer equals or is larger than that in the second wiring pattern layer.

With this process, the balance of the concentration of the dopant prevents the diffusion of the dopant from the second wiring pattern layer to the first wiring pattern layer during thermal treatment after forming the second wiring pattern layer, thereby the first object is achieved.

The dopant is injected into the first wiring pattern layer at the time of or after forming the first wiring pattern layer. When the first wiring pattern layer is formed by a sputtering method, a metal silicide including dopant is used as the sputtering target. When the first wiring pattern layer is formed by CVD, at least two kinds of gas are selected so that a metal silicide layer including metal, silicon and dopant is formed through chemical reaction.

If the metal silicide including the dopant is used as a sputtering target, it reduces the generation of particles due to charge-up even when a DC magnetron sputtering device is used, and thereby the second object is achieved. Such a sputtering target may be produced by a physical process by baking metal silicide particles under high-pressure or by a chemical process using CVD. The physical process to produce the sputtering target comprises a step to make doped silicon particles by adding dopant to silicon, a step to produce metal silicide particles from the doped silicon particles and metal through thermal reaction, and a step to bake the metal silicide particles under high-pressure or to bake the metal silicide particles and the doped silicon particles under high-pressure. In the chemical process to produce the sputtering target, at least two kinds of gas are selected so that metal silicide layer including metal, silicon and dopant is formed on a base plate through chemical reaction.

In the case when the dopant included in the first wiring pattern layer is added after the first wiring pattern layer has been formed, the process comprises a step for forming metal silicide layer without dopant and a step for adding the dopant to the metal silicide layer. The dopant may be diffused to the metal silicide layer from a layer that is in contact with the metal silicide layer or may be directly injected to the metal silicide layer by ion implantation.

In order to diffuse the dopant from the contact layer, there may comprises a step for forming a doped silicon layer on the metal silicide layer, and a step of a thermal treatment to oxidize the doped silicon layer and to diffuse the dopant included in the doped silicon layer into the metal silicide layer. Further, the first wiring pattern may be formed by the photo lithography process (a patterning step) before or after the formation of the doped silicon layer.

According to a second aspect, there is provided process or manufacturing a semiconductor device comprising: a first wiring pattern forming step in which a first wiring pattern layer is formed from metal silicide without dopant; an insulator layer forming step in which an insulator layer is formed to cover the first wiring pattern layer; a contact hole forming step in which a contact hole is formed through the insulator layer; a second wiring pattern layer forming step in which a second wiring pattern including dopant is formed by CVD with controlling flow of addition gas so that the concentration of the dopant gradually decreases with growth of the layer for covering the insulator layer as well as the contact hole proceeds; a diffusing step in which the dopant included in the second wiring pattern layer is diffused into the first wiring pattern layer; and wherein the concentration of the dopant at the time of forming the second wiring pattern layer is designed so as to obtain good contact between the first and second wiring pattern layers after the diffusion step.

The second aspect admits the diffusion of the dopant from the first wiring pattern layer to the second wiring pattern layer. In the prior art, such a diffusion was a defect to increase contact resistance. The difference between the second aspect and the prior art is the initial concentration of the dopant in the second wiring pattern layer. That is, the concentration of the dopant in the second wiring pattern layer is high enough to keep a sufficient concentration after diffusion.

DETAILED DESCRIPTION OF THE PREFERRED EMBODIMENTS

Embodiments of the present invention will hereinafter be discussed with reference to the accompanying drawings.

[Embodiment 1]

The first embodiment is shown in FIG. 1 with sectional views of a semiconductor device in each of the steps. In the following embodiments, a gate of an FET is formed on a silicon substrate, the gate is covered by an insulator layer, and a wiring pattern is connected with the gate via a contact hole formed through the insulator layer. The first embodiment is characterized in that a tungsten silicide layer as the metal silicide layer is formed by a sputtering method using a sputtering target that includes dopant. That is, the dopant is injected in the forming step of the tungsten silicide layer.

Figure 1A:
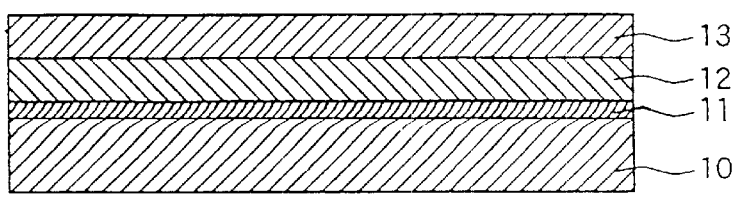
FIG. 1 shows sectional views in each of steps of the process for manufacturing a semiconductor device according to the first embodiment.

In the first embodiment, as shown in FIG. 1(a), a gate oxide layer 11 having 7 through 15 nm in thickness is formed at the surface of a silicon substrate 10 through thermal oxidation, poly-silicon is deposited on the gate oxide layer 11 by CVD, and then the dopant to give conductivity to the silicon, such as phosphorus (P) or arsenic (As) is injected into the silicon layer in an ion implantation process in order to form a poly-silicon layer 12. A tungsten silicide (WSi) layer including dopant is formed as a metal silicide layer on the poly-silicon layer 12 through the sputtering method, and this tungsten silicide layer composes a first wiring pattern layer 13. This process corresponds to the first wiring pattern forming step. In this embodiment, a donor such as phosphorus (P) or arsenic (As) is used as the dopant to create n-type regions. An acceptor such as boron (B), gallium (Ga) or indium (In) may be used as dopant to create p-type regions.

Figure 1B:
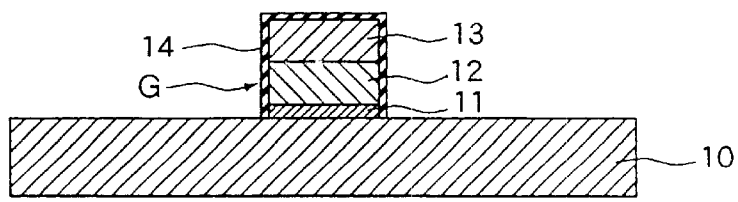
Figure 1C:
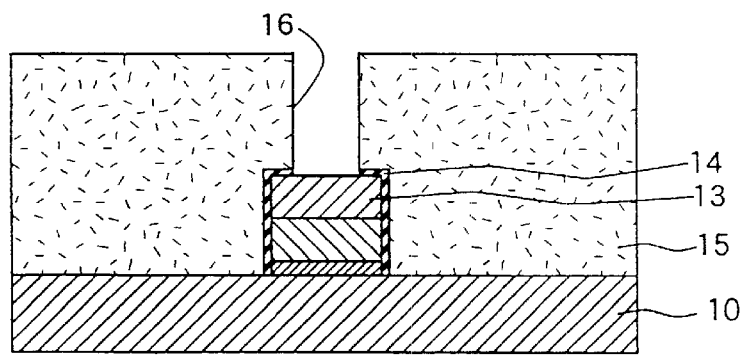
Figure 1D:
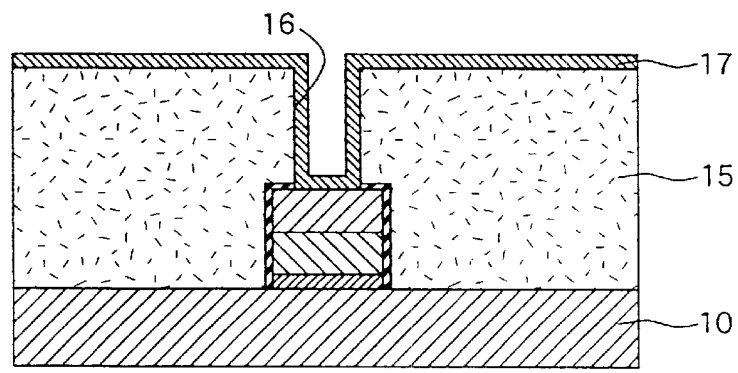
Figure 1E:
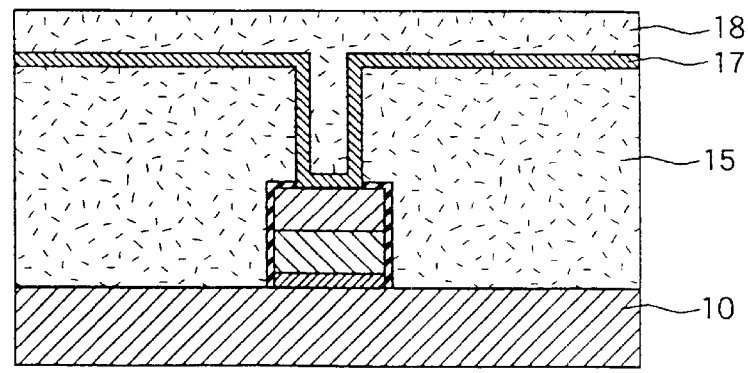

Next, as shown in FIG. 1(b), a gate G is formed by removing a surrounding portion of the gate oxide layer 11, the poly-silicon layer 12 and the first wiring pattern layer 13 through the photo lithography process (that corresponds to the patterning step). After the gate G is formed, an insulator film 14 is formed at the surface of the gate G through thermal oxidation. Subsequently, as shown in FIG. 1(c), a first insulator layer 15 is formed through the thermal treatment from a BPSG layer that is formed by CVD to cover the first wiring pattern layer 13 (that corresponds as an insulator layer forming step). A contact hole 16 is formed through the first insulator layer 15 and the insulator film 14 to expose the first wiring pattern layer 13 (that corresponds to a contact hole forming step). A Poly-silicon layer is deposited by CVD as shown in FIG. 1(d) and phosphorus (P) or arsenic (As) is doped in by an ion implantation process. A second wiring pattern is formed on the poly-silicon layer, thereby a second wiring pattern layer 17 is formed (that corresponds to a second wiring pattern layer forming step). Finally, as shown in FIG. 1(e), BPSG is deposited by CVD and a second insulator layer 18 is formed through thermal treatment.

The first wiring pattern layer 13 is formed by the sputtering method using metal silicide including dopant as sputtering target, and the concentration of the dopant in the first wiring pattern layer 13 equals or is lager than that in the second wiring pattern layer 17. In an actual example, the concentration of phosphorus (P) or arsenic (As) in the first wiring pattern layer 13 falls in the rage of about $5 \times 10^{19}$ to $5 \times 10^{20}$ atoms/cm$^2$, the concentration of the phosphorus (P) or arsenic (As) in the second wiring pattern layer 17 is about $5 \times 10^{20}$ atoms/cm$^2$. Since the concentrations of dopants in the first and second wiring pattern layers 13 and 17 are similar, it prevents the diffusion of the dopant from the second wiring pattern layer 17 to the first wiring pattern layer 13 at the time of the thermal treatment for the second insulator layer 18. The contact resistance between the first and second wiring pattern layers 13 and 17 is kept or a low level, and an ohmic contact can be obtained.

When the first wiring pattern layer 13 is formed by sputtering method, the sputtering target may be produced by a physical process by baking metal silicide particles under high-pressure or by a chemical process using CVD.

In the first place, the physical method for producing the sputtering target will be described. Phosphorus (P) or arsenic (As) is added to heated melted silicon so that the concentration of the dopant falls in the range of about $1 \times 10^{20}$ to $1 \times 10^{21}$ atoms/cm$^2$, thereby doped silicon is produced. Doped silicon particles are produced by cooling and breaking the doped silicon crystal. The diameter of the silicon particle falls in the range of about 0.1 to 10.0 μm. Next, tungsten particles that are broken into 0.1 to 10.0 μm in diameter and the doped silicon particles are mixed so that the molar ratio W:Si is 1:2. Alloy particles of tungsten silicide (WSi$_{2.0}$) are produced from the mixture through thermal treatment at 500 to 800° C. in a vacuum or inert gas such as argon.

The alloy particles of tungsten silicide (WSi$_{2.0}$) are mixed with the doped silicon particle so that a molar ratio WSi$_{2.0}$:Si falls in the range of 1:0.20 to 1:0.26, and then alloy particles of tungsten silicide ($WSi_{2.6}$ to $WSi_{2.8}$) are produced from the mixture through pressured thermal treatment at 500 to 1000° C. in a vacuum or inert gas such as argon. Since the silicon in the produced doped tungsten silicide target includes a dopant whose concentration falls in the range of about $1\times10^{20}$ to $1\times10^{21}$ atoms/cm$^2$, it is a conductor whose specific electric resistance is about 0.001 to 0.010 ohm/cm. When this doped tungsten silicide sputtering target is used, charge-up can be prevented even if a general DC magnetron sputtering device is used, and therefore, it can prevent generation of particles due to abnormal discharge, and it allows to form a high quality tungsten silicide layer.

On the other hand, when the sputtering target is produced in a chemical reaction, at least two kinds of gas are selected so that a metal silicide layer including metal, silicon and dopant is formed by CVD. A ceramics base plate that has the same diameter as the sputtering target is arranged in a vacuum chamber, and the plate is heated at 400 to 800° C. As tungsten hexafluoride gas ($WF_6$) and silane gas ($SiH_4$) are supplied to the chamber, the tungsten silicide film ($WSi_x$) is formed on the ceramics base plate according to the following reaction:

$$WF_6 + 3SiH_4 \rightarrow WSi_2 + SiF_4 + 2HF + 5H_2.$$

During the reaction, phosphine ($PH_3$) or arsine ($AsH_3$) is supplied to a chamber. Such the compound is decomposed into dopant (P or As) and hydrogen according to the following reactions, the dopant is mixed in the tungsten silicide layer.

$$2PH_3 \rightarrow 2P + 3H_2,$$

$$2AsH_3 \rightarrow 2As + 3H_2.$$

When the sputtering target is produced by CVD, the composition of silicon in the tungsten silicide is determined depending on flow ratio between tungsten hexafluoride gas ($WF_6$) and silane gas ($SiH_4$). Further, the concentration of the dopant is easily controlled by adjusting flow of phosphine ($PH_3$) or arsine ($AsH_3$). In this embodiment, the flow of the dopant is adjusted so that the concentration of the dopant in the produced tungsten silicide sputtering target falls in the range of $1\times10^{20}$ to $1\times10^{21}$ atoms/cm$^2$.

The sputtering target produced by CVD has a higher density than that by the physical method, and includes extremely small amount of oxygen. If the target includes a large amount of oxygen, silicon in the target reacts with oxygen to form silicon oxide through thermal treatment. Since the silicon oxide is an insulator, it causes abnormal discharge. When a sputtering target produced by CVD is used, it can prevent generation of the silicon oxide, and it certainly prevents generation of particles due to abnormal discharge.

[Embodiment 2]

Next, a second embodiment will be described. In the second embodiment, a tungsten silicide layer is formed by CVD as a metal silicide layer. Dopant is injected into the tungsten silicide layer using dopant gas during the forming process of the tungsten silicide. Further, all the steps except the first wiring pattern forming step are similar to those of the first embodiment and the constructions of the semiconductor device are similar to FIG. 1(a) to FIG. 1(e).

In the second embodiment, a gate oxide layer 11 and a poly-silicon layer 12 are formed on a silicon substrate 10 an the same manner as the first embodiment. A tungsten silicide (WSi) layer that includes dopant is formed by CVD as the metal silicide layer. This layer is designated a first wiring pattern layer 13, and this step corresponds the first wiring pattern layer forming step.

Subsequently, a gate G is formed by removing a surrounding portion of the gate oxide layer 11, the poly-silicon layer 12 and the first wiring pattern layer 13 (that corresponds to a patterning step), an insulator film 14 is formed by thermal oxidation. Then, a first insulator layer 15 is formed from BPSG (that corresponds to an insulator layer forming step), a contact hole 16 is formed (that corresponds to a contact hole forming step). After that, a second wiring pattern layer 17 is formed and a second insulator layer 18 is formed from BPSG.

At the step for forming the first wiring pattern layer 13, the silicon substrate 10 is set in a vacuum chamber. The substrate 10 is heated at 400 to 550° C., and tungsten hexafluoride gas ($WF_6$), silane gas ($SiH_4$) and dopant gas such as phosphine ($PH_3$) or arsine ($AsH_3$) are supplied to the chamber. The tungsten silicide ($WSi_x$) layer is formed upon the substrate and the dopant is mixed in this tungsten silicide layer according to the following reactions;

$$WF_6 + 3SiH_4 \rightarrow WSi_2 + SiF_4 + 2HF + 5H_2,$$

$$2PH_3 \rightarrow 2P + 3H_2$$

or $$2AsH_3 \rightarrow 2As + 3H_2.$$

When the first wiring pattern layer 13 is formed by CVD, the composition of silicon in the tungsten silicide is determined depending on the flow ratio between tungsten hexafluoride gas ($WF_6$) and silane gas ($SiH_4$). Further, the concentration of the dopant is easily controlled by adjusting the flow of phosphine ($PH_3$) or arsine ($AsH_3$). In this embodiment, flow of the dopant is adjusted so that the concentration of the dopant in the first wiring pattern layer 13 falls in the range of $5\times10^{19}$ to $5\times10^{20}$ atoms/cm$^2$. As described above, since the concentration of the dopant (P or As) in the second wiring pattern layer 17 is about $5\times10^{20}$ atoms/cm$^2$, which is similar to the concentration in the first wiring pattern layer 13, it prevents diffusion of the dopant from the second wiring pattern layer 17 to the first wiring pattern layer 13. And therefore, the contact resistance between the first and second wiring pattern layers 13 and 17 is kept in low level, and the ohmic contact can be obtained. Further, since the first wiring pattern layer 13 is formed by CVD in the second embodiment, generation of particles due to abnormal discharge does not become an issue, and then the first wiring pattern 13 is formed as a high quality tungsten silicide layer.

In the second embodiment, it is desirable that the poly-silicon layer 12 and the first wiring pattern layer 13 are formed in the same vacuum chamber as a continuous process. The advantage of such the process is preventing crack in the gate oxide layer 11 due to stress in the first wiring pattern layer 13. When the first wiring pattern layer 13 is directly formed on the poly-silicon layer 12, that is, an oxide layer is not formed between these layers, silicon included in these layers can transfer over the boundary between these layers. And therefore, even if silicon in the first wiring pattern layer 13 is spent for forming the insulator film (silicon oxide film) 14, the poly-silicon layer 12 supplies the first wiring pattern layer 13 with silicon.

In contrast, if the poly-silicon layer 12 is formed in the first vacuum chamber and the first wiring pattern layer 13 is formed in a second vacuum chamber that is different from the first vacuum chamber, oxygen in the air changes the surface of the poly-silicon layer 12 into silicon oxide when the substrate is taken out from the first vacuum chamber. The silicon oxide layer formed between the poly-silicon layer 12 and the first wiring pattern layer 13 disturbs transformation of silicon between these layers, and the poly-silicon layer 12 cannot supply the first wiring pattern layer 13 with silicon. And therefore, when silicon in the first wiring pattern layer 13 is spent for forming the insulator film 14, it reduces the composition of silicon in the first wiring pattern layer 13. The reduction of the composition of silicon causes stress in the first wiring pattern layer 13 and it may crack the gate oxide layer 11.

[Embodiment 3]

A manufacturing process of a semiconductor device according to a third embodiment will be described hereinafter. In the third embodiment and the later embodiments, the manufacturing process includes a step for forming metal silicide layer without dopant and a step for adding the dopant to the metal silicide layer. Further, a construction of the semiconductor device at each of the steps is similar to that of the first embodiment.

In the third embodiment, a gate oxide layer 11 and a poly-silicon layer 12 are formed on a silicon substrate 10 in the same manner as the first embodiment. A tungsten silicide (WSi) layer that does not include dopant is formed by a sputtering method or CVD as the metal silicide layer. This layer is designated a first wiring pattern layer 13, and this step corresponds to the first wiring pattern layer forming step.

Subsequently, a gate G is formed by removing a surrounding portion of the gate oxide layer 11, the poly-silicon layer 12 and the first wiring pattern layer 13 (that corresponds to a patterning step), and insulator film 14 is formed by thermal oxidation. Then, a first insulator layer 15 is formed from BPSG (that corresponds to an insulator layer forming step), a contact hole 16 is formed (that corresponds to a contact hole forming step). After that, dopant such as phosphorus (P) or arsenic (As) is injected into the first wiring pattern layer 13 through ion implantation (that corresponds to a dopant adding step). The ion is implanted so that the concentration of the dopant in the exposure exposed part of the first wiring pattern layer 13 falls in the range of $5 \times 10^{19}$ to $5 \times 10^{20}$ atoms/cm$^2$. After the dopant is injected, a second wiring pattern layer 17 is formed (that corresponds to a second wiring pattern layer forming step), and a second insulator layer 18 is formed from BPSG.

According to the third embodiment, because of the injection of the dopant into the first wiring pattern layer 13, the concentration of the dopant in the first wiring pattern layer 13 at the contact with the second wiring pattern layer 17 can be similar to that in the second wiring pattern layer 17. As a result, the contact resistance between the first and second wiring pattern layers 13 and 17 is kept at a low level, and an ohmic contact can be obtained. Further, when the first wiring pattern layer 13 is formed by CVD, generation of particles due to abnormal discharge does not become an issue, and then the first wiring pattern 13 is formed as a high quality tungsten silicide layer.

[Embodiment 4]

FIG. 2 shows a fourth embodiment according to the present invention. In the fourth embodiment, the manufacturing process includes a step for forming a metal silicide layer without dopant and a step for adding the dopant to the metal silicide layer, and particularly, the dopant adding step includes a step for forming a doped silicon film on the metal silicide layer and a step for thermally oxidizing the doped silicon film to diffuse the dopant in the doped silicon film to the metal silicide layer.

Figure 2A:
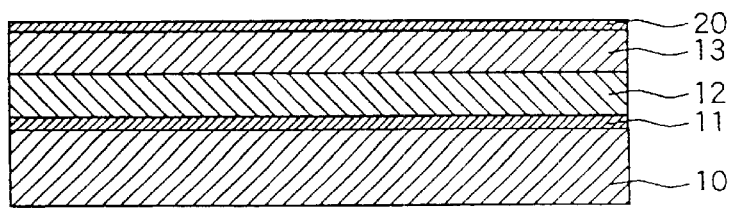
FIG. 2 shows sectional views in each of steps of the process for manufacturing a semiconductor device according to the fourth embodiment.

In the fourth embodiment, a gate oxide layer 11 and a poly-silicon layer 12 are formed on a silicon substrate 10 in the same manner as the first embodiment. A tungsten silicide (WSi) layer that does not include dopant is formed by a sputtering method or CVD as the metal silicide layer. This layer is designated a first wiring pattern layer 13, and this step corresponds to a first wiring pattern layer forming step. Next, as shown in FIG. 2(a), a doped silicon film 20 is deposited on the first wiring pattern layer 13 by a sputtering method using a doped silicon target that includes phosphorus (P) or arsenic (As). The concentration of the dopant in the doped silicon target falls in the range of about $1 \times 10^{20}$ to $1 \times 10^{21}$ atoms/cm$^2$.

Figure 2B:
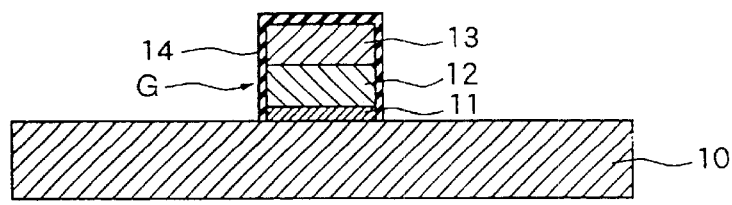

Subsequently, a gate G is formed by removing the surrounding portion of the gate oxide layer 11, the poly-silicon layer 12, the first wiring pattern layer 13 and the doped silicon film 20 as shown in FIG. 2(b) (that corresponds to a patterning step). The doped silicon film 20 is oxidized by heating the substrate having the gate G at 800 to 950° C. to diffuse dopant included in the doped silicon film 20 into the first wiring pattern layer 13 (that corresponds to a thermal oxidation step). The surface of the gate G is changed to an insulator film 14 through the thermal oxidation step. The doped silicon film 20 that existed on the top of the gate G is changed to the an oxide silicon layer and it is united with the insulator film 14.

Figure 2C:
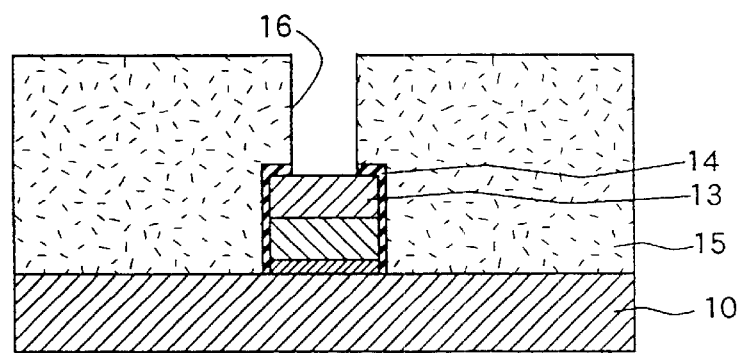
Figure 2D:
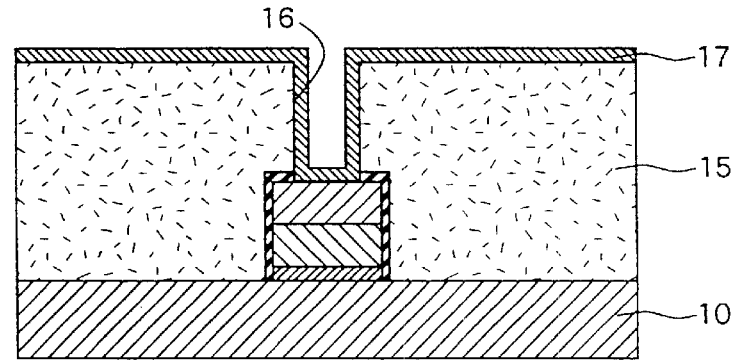
Figure 2E:
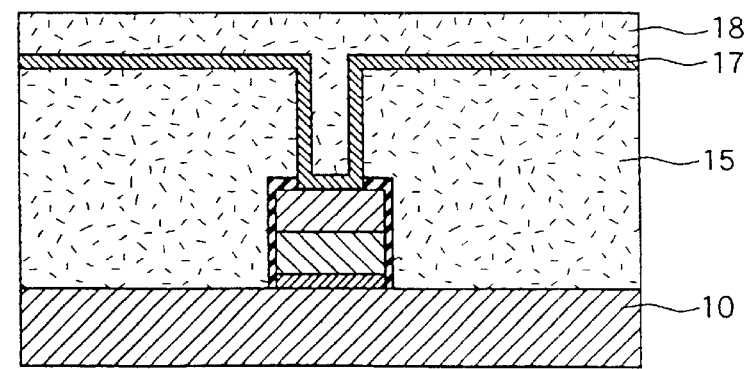

Then, as shown in FIG. 2(c), a first insulator layer 15 is formed from BPSG (that corresponds an an insulator layer forming step), a contact hole 16 is formed (that corresponds a contact hole forming step). After that, as shown in FIG. 2(d), a second wiring pattern layer 17 is formed (that corresponds to a second wiring pattern layer forming step), and BPSG is deposited on it to form a second insulator layer 18 as shown in FIG. 2(e).

According to the fourth embodiment, because of the diffusion of the dopant from the doped silicon film 20 to the first wiring pattern layer 13, the concentration of the dopant in the first wiring pattern layer 13 can be similar to that in the second wiring pattern layer 17. As a result, the contact resistance between the first and second wiring pattern layers 13 and 17 is kept at a low level, and an ohmic contact can be obtained. Further, when the first wiring pattern layer 13 is formed by CVD, generation of particles due to abnormal discharge does not become an issue, and then the first wiring pattern 13 is formed as a high quality tungsten silicide layer.

A further advantage of the fourth embodiment is preventing a crack in the gate oxide layer 11 due to stress in the first wiring pattern layer 13. The composition of the silicon in the first wiring pattern layer 13 does not change so much at the time of forming the silicon oxide layer 14, because the doped silicon film 20 that covers the first wiring pattern layer 13 is changed to the silicon oxide layer. Therefor, the stress in the first wiring pattern layer can be prevented, and the gate oxide layer 11 does not crack.

At the patterning step of the fourth embodiment, photoresist is applied on the doped silicon film 20, the photoresist is exposed using a stepper and it is develop to form a mask for etching. Because of low reflectance of the doped silicon film 20 at a typical wavelength of 365 nm (called i-line), the light passed through the photoresist is hardly reflected from the doped silicon film 20. And therefore, since the light illuminates only proper portions, the mask accurately conforms to the projected pattern. If a layer under the photoresist has high reflectance, the light passed through the photoresist is reflected back and exposes improper portions of the photoresist, the mask cannot conform to the projected pattern.

[Embodiment 5]

FIG. 3 shows a fifth embodiment according to the present invention. In the fifth embodiment, the manufacturing process includes a step for forming metal silicide layer without dopant and a step for adding the dopant to the metal silicide layer, and particularly, the dopant adding step includes a step for forming a doped silicon film on the metal silicide layer and a step for thermally oxidizing the doped silicon film to diffuse the dopant from the doped silicon film to the metal silicide layer.

Figure 3A:
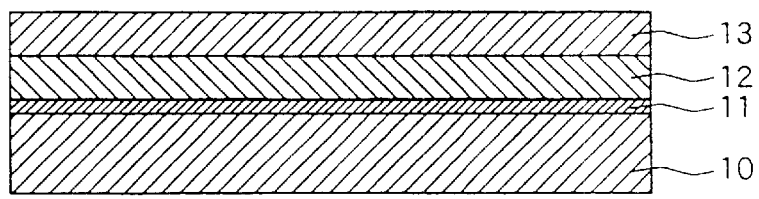
FIG. 3 shows sectional views in each of steps of the process for manufacturing a semiconductor device according to the fifth embodiment.

In the fifth embodiment, as shown in FIG. 3(a), a gate oxide layer 11 and a poly-silicon layer 12 are formed on a silicon substrate 10 as in the same manner as the first embodiment. A tungsten silicide (WSi) layer that does not include dopant is formed by a sputtering method or CVD as the metal silicide layer. This layer is designated a first wiring pattern layer 13, and this step corresponds to a first wiring pattern layer forming step.

Figure 3B:
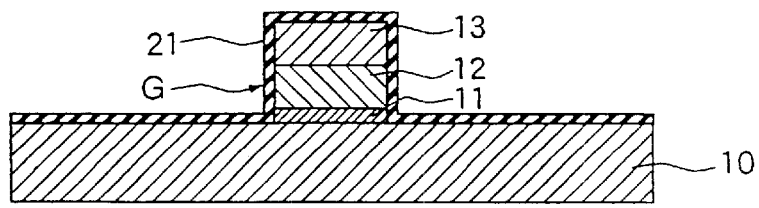

Subsequently, a gate G is formed by removing the surrounding portion of the gate oxide layer 11, the poly-silicon layer 12, and the first wiring pattern layer 13 as shown in FIG. 3(b) (that corresponds to a patterning step). After the patterning step, a doped silicon film 21 is deposited by a sputtering method using a doped silicon target that includes phosphorus (P) or arsenic (As) (that corresponds to a silicon film forming step). The concentration of the dopant in the doped silicon target falls in the range of about $1 \times 10^{20}$ to $1 \times 10^{21}$ atoms/cm$^2$. As a result, the top and side surfaces of the gate G and the surrounding portion of the substrate 10 are covered by the doped silicon film 21.

Next, the doped silicon film 21 is oxidized by heating the substrate having the gate G at 800 to 950° C. to diffuse dopant included in the doped silicon film 21 into the first wiring pattern layer 13 (that corresponds to a thermal oxidation step).

Figure 3C:
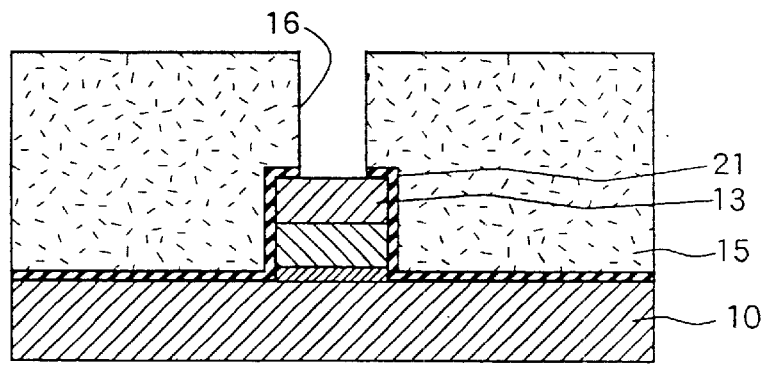
Figure 3D:
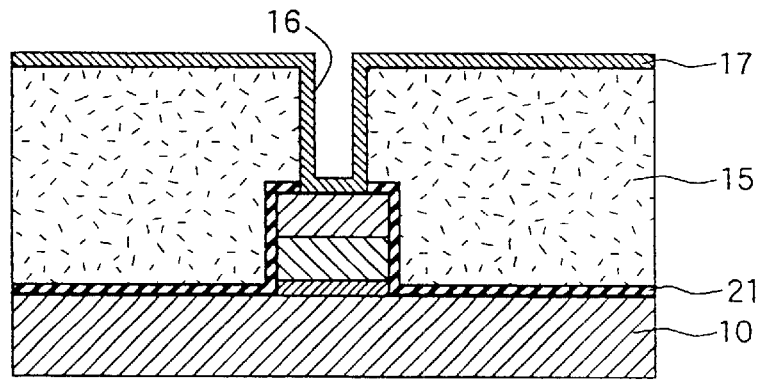
Figure 3E:
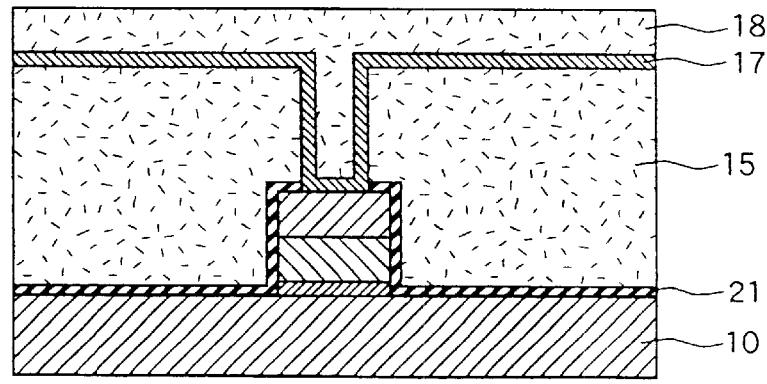
Figure 4A:
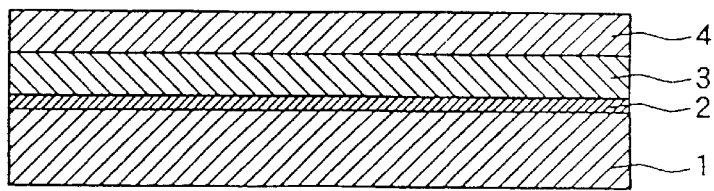
FIG. 4 shows sectional views in each of steps of the process for manufacturing a semiconductor device according to the prior art.
Figure 4B:
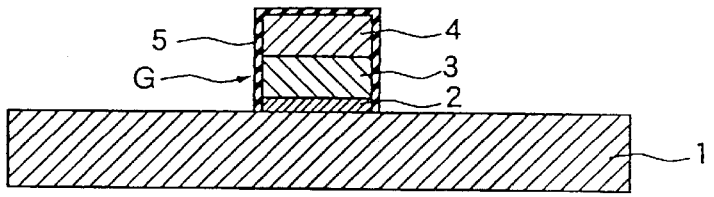
Figure 4C:
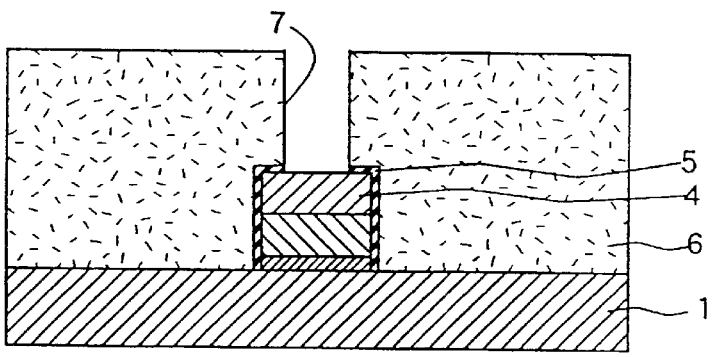
Figure 4D:
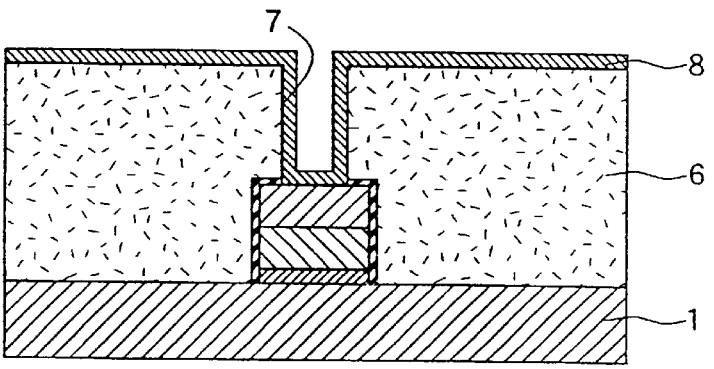
Figure 4E:
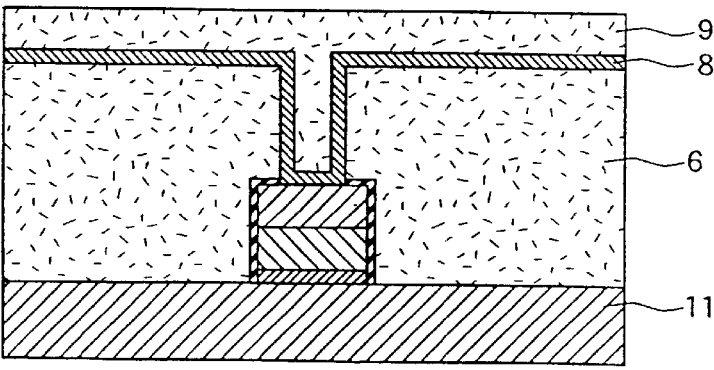

Then, as shown in FIG. 3(c), a first insulator layer 15 is formed from BPSG (that to corresponds an insulator layer forming step), a contact hole 16 is formed (that corresponds to a contact hole forming step). After that, as shown in FIG. 3(d), a second wiring pattern layer 17 is formed (that corresponds to a second wiring pattern layer forming step), and BPSG is deposited on it to form a second insulator layer 18 as shown in FIG. 3(e).

According to the fifth embodiment, because of the diffusion of the dopant from the doped silicon film 21 to the first wiring pattern layer 13, the concentration of the dopant in the first wiring pattern layer 13 can be similar to that in the second wiring pattern layer 17. As a result, the contact resistance between the first and second wiring pattern layers 13 and 17 is kept at a low level, and the ohmic contact can be obtained. Since the doped silicon film 21 covers not only the top surface of the first wiring pattern 13 but also the side surface thereof, the diffusion effect of the dopant is higher than that in the fourth embodiment. Further, when the first wiring pattern layer 13 is formed by CVD, generation of particles due to abnormal discharge does not become an issue, and then the first wiring pattern 13 is formed as a high quality tungsten silicide layer.

Moreover, according to the fifth embodiment, the composition of the silicon in the first wiring pattern layer 13 is hardly changed, because only the doped silicon film 21 is oxidized in the thermal oxidation step. And therefore, the stress in the first wiring pattern layer can be prevented, and the gate oxide layer 11 does not crack.

[Embodiment 6]

Finally, a sixth embodiment will be described. In the sixth embodiment, it is admitted that the dopant diffuses from a first wiring pattern layer to a second wiring pattern layer. Initial concentration of the dopant in the second wiring pattern layer is high enough to keep sufficient concentration after diffusion. Further, a construction of the semiconductor device at each of the steps is similar to that of the first embodiment.

In the sixth embodiment, a gate oxide layer 11 and a poly-silicon layer 12 are formed on a silicon substrate 10 in the same manner as the first embodiment. A tungsten silicide (WSi) layer that does not include dopant is formed by a sputtering method or CVD as the metal silicide layer. This layer is designated a first wiring pattern layer 13, and this step corresponds to the first wiring pattern layer forming step.

Subsequently, a gate G is formed by removing to surrounding portion of the gate oxide layer 11, the poly-silicon layer 12 and the first wiring pattern layer 13 (that corresponds a patterning step), and an insulator film 14 is formed by thermal oxidation. Then, a first insulator layer 15 is formed from BPSG (that corresponds to an insulator layer forming step), a contact hole 16 is formed (that corresponds to a contact hole forming step). After that, a second wiring pattern layer 17 is formed by CVD for covering the first insulator layer 15 as well as the contact hole 16 (that corresponds to a second wiring pattern layer forming step), BPSG is deposited on the second wiring pattern layer 17 and it becomes a second insulator layer 18 through thermal treatment. A part of the dopant included in the second wiring pattern layer 17 diffuses to the first wiring pattern layer during the thermal treatment for forming the second insulator layer 18. That is, this step of thermal treatment corresponds to a diffusion step.

In the second wiring pattern layer forming step, ingredient gas for forming the poly-silicon layer and dopant gas such as phosphine (PH$_3$) are supplied to deposit the second wiring pattern layer by CVD. Phosphine (PH$_3$) is decomposed into phosphorus (P) and hydrogen through thermal treatment, and phosphorus (P) is doped in the poly-silicon layer. The phosphorus content can be controlled by adjusting the flow of phosphine (PH$_3$) gas. When the second wiring pattern layer 17 is formed by CVD, the flow of phosphine gas is adjusted so that the concentration of phosphorus gradually decreases with growth of the layer. That is, the concentration of phosphorus in the second wiring pattern layer 17 is higher at the lower side (the side of the first wiring pattern layer 13) than that at the upper side (the side of the second insulator layer 18).

In the diffusion step, as a result of the diffusion, the concentration of the dopant in the second wiring pattern layer 17 decreases. Particularly, the ratio of decrease at the lower side is larger than that at the upper side. Since the initial concentration of the dopant at the lower side in the second wiring pattern layer 17 is high enough, even if the dopant diffuses into the first wiring pattern layer 13, the second wiring pattern layer 17 can keep enough concentration of the dopant to obtain a good contact. In an example, the initial concentration of the dopant in the second wiring pattern layer 17 is adjusted so that the concentration after the diffusion is about $5 \times 10^{20}$ atoms/cm$^2$. Further, because of the gradation of the concentration in the second wiring pattern layer 17, the concentration at the lower side can be kept high enough after the diffusion, and eduction of the dopant can be prevented due to the low average concentration.

According to the sixth embodiment, because of the diffusion of the dopant to the first wiring pattern layer 13 from the second wiring pattern layer 17, the concentration of the dopant in the first wiring pattern layer 13 can be similar to that in the second wiring pattern layer 17 at the boundary part of these layers. As a result, the contact resistance between the first and second wiring pattern layers 13 and 17 is kept at a low level, and the ohmic contact can be obtained. Further, when the first wiring pattern layer 13 is formed by CVD, generation of particles due to abnormal discharge does not become an issue, and then the first wiring pattern 13 is formed as a high quality tungsten silicide layer.

What is claimed is:

1. A method of manufacturing a semiconductor device, comprising:
    forming a first wiring pattern layer from metal silicide including dopant on a surface of a substrate;
    forming an insulator layer to cover said first wiring pattern layer;
    forming a contact hole through said insulator layer to said first wiring pattern layer;
    forming a second wiring pattern layer including dopant for covering said insulator layer as well as said contact hole; and
    wherein a concentration of the dopant in said first wiring pattern layer equals or is larger than that in said second wiring pattern layer.

2. The method of manufacturing a semiconductor device according to claim 1, wherein said first wiring pattern layer is formed by sputtering method using a metal silicide sputtering target that includes dopant.

3. The method of manufacturing a semiconductor device according to claim 2, wherein said sputtering target is produced by a physical process comprising:
    producing doped silicon particles by adding dopant to silicon;
    producing metal silicide particles from said doped silicon particles and metal through thermal reaction; and
    baking said metal silicide particles under high-pressure or said metal silicide particles and said doped silicon particles under high-pressure.

4. The method of manufacturing a semiconductor device according to claim 2, wherein said sputtering target is produced by CVD process in which at least two kinds of gas are selected so that metal silicide layer including metal, silicon and dopant is formed on a base plate through chemical reaction.

5. The method of manufacturing a semiconductor device according to claim 1, wherein said first wiring pattern layer is formed by CVD using at least two kinds of gas to form metal silicide layer including metal, silicon and dopant through chemical reaction.

6. The method of manufacturing a semiconductor device according to claim 1, wherein said step 1 forming said first wiring pattern layer further includes:
    forming a metal silicide layer that does not include dopant on the substrate surface; and
    adding dopant to the metal silicide layer formed by the former step.

7. The method of manufacturing a semiconductor device according to claim 6, wherein said dopant adding step further includes:
    a step for forming a doped silicon film upon said metal silicide layer; and
    thermally oxidizing said doped silicon film to diffuse the dopant in said doped silicon film into said metal silicide layer.

8. The method of manufacturing a semiconductor device according to claim 7, further comprising patterning said silicon oxide layer and said metal silicide layer, and wherein said patterning step is executed between said thermal oxidation step and said insulator layer forming step.

9. The method of manufacturing a semiconductor device according to claim 7, further comprising patterning said silicon oxide layer and said metal silicide layer, and wherein said patterning step is executed between said metal silicide layer forming step and said silicon film forming step.

10. The method of manufacturing a semiconductor device according to claim 6, wherein said dopant is injected into said metal silicide layer through ion implantation in said dopant adding step.

11. A method of manufacturing a semiconductor device, comprising:
    forming a first wiring pattern layer from metal suicide without dopant on a surface a substrate;
    forming an insulator layer to cover said first wiring pattern layer;
    forming a contact hole through said insulator layer to said first wiring pattern layer;
    forming a second wiring pattern layer including dopant by CVD for covering said insulator layer as well as said contact hole, wherein flow of dopant gas is adjusted so that the concentration of dopant gradually decreases with growth of the layer;
    diffusing the dopant included in said second wiring pattern layer into said first wiring pattern layer; and
    wherein the initial concentration of the dopant in said second wiring pattern layer is sufficiently high so as to produce an ohmic contact with said first wiring pattern layer after said diffusion step.

12. A method of manufacturing a semiconductor device, comprising:
    forming a metal silicide layer including dopant on a surface of a substrate;
    forming an insulator layer on said metal silicide layer;
    forming a contact hole in the insulator layer and exposing a portion of said metal silicide layer; and,
    forming a conductive layer including dopant in the contact hole, with said conductive layer contacting and being electrically connected to the metal silicide layer;
    wherein a concentration of the dopant in said metal silicide layer substantially equals or is larger than that in said conductive layer.

13. A method of manufacturing a semiconductor device, comprising:
    forming a metal silicide layer on a surface of a substrate;
    forming an insulator layer on said metal silicide layer;
    forming a contact hole in the insulator layer and exposing a portion of said metal silicide layer;
    implanting dopant ions into the metal silicide layer through said contact hole; and,
    forming a conductive layer including dopant in the contact hole, with said conductive layer contacting and being connected to the metal silicide layer.

14. A method according to claim 13 wherein the metal silicide layer produced during the step of forming a metal silicide layer is an undoped layer.

15. A method according to claim 13 wherein a concentration of the dopant in said metal silicide layer at the point of contact with the conductive layer substantially equals or is larger than that in the conductive layer.

16. A method of manufacturing a semiconductor device, comprising:

forming a metal silicide layer on a surface of substrate;

forming a first conductive layer including dopant on the metal silicide layer;

diffusing a portion of the dopant included in the first conductive layer into the metal silicide layer;

forming an insulator layer on said first conductive layer;

forming a contact hold in the insulator layer and exposing a portion of said first conductive layer; and forming a second conductive layer including dopant in the contact hole, with the second conductive layer contacting and connecting to the first conductive layer.

* * * * *